United States Patent [19]
Ehara

[11] Patent Number: 4,907,051
[45] Date of Patent: Mar. 6, 1990

[54] PHOTOCATHODE

[75] Inventor: Shaw Ehara, Nara, Japan

[73] Assignee: Sharp Kabushiki Kaisha, Osaka, Japan

[21] Appl. No.: 193,502

[22] Filed: May 12, 1988

[30] Foreign Application Priority Data

May 22, 1987 [JP] Japan ................................ 62-126139

[51] Int. Cl.[4] ........................ H01L 27/14; H01L 45/00
[52] U.S. Cl. ............................................ 357/30; 357/2; 357/16; 357/31; 357/52
[58] Field of Search ............. 357/30 B, 30, 2 E, 30 K, 357/30 N, 52, 31, 16

[56] References Cited

U.S. PATENT DOCUMENTS

| | | | |
|---|---|---|---|
| 3,632,442 | 1/1972 | Turnbull | 117/219 |
| 3,644,770 | 2/1972 | Bell | 313/94 |
| 4,107,564 | 8/1978 | Klimin et al. | 313/94 |
| 4,612,559 | 9/1986 | Hilotsuyanagi et al. | 357/2 |
| 4,710,786 | 12/1987 | Ovshinsky et al. | 357/2 |

*Primary Examiner*—Martin H. Edlow
*Assistant Examiner*—Stephen D. Meier
*Attorney, Agent, or Firm*—Flehr, Hohbach, Test, Albritton & Herbert

[57] ABSTRACT

A photocathode with high photoelectric conversion ratio over an extended wavelength range of incident light has a hetero junction formed between thin films of a p-type amorphous silicon alloy having energy gap matching the energy of the incident light and an n-type semiconductor with small work function or large coefficient of secondary electron emission.

13 Claims, 2 Drawing Sheets

PHOTOCATHODE

BACKGROUND OF THE INVENTION

This invention relates to a photocathode with a high photoelectric conversion ratio and a large area.

A photocathode is a transducer of an important kind for converting light into an electric signal. Although many kinds of photocathodes have been used in the past, there has been none having a high photoelectric conversion ratio over a wide wavelength range of incident light. A photocathode composed mainly of silver oxide, for example, has a peak in its photoelectric conversion ratio at wavelength of about 6000 Å but this ratio becomes about ½ of the peak value at wavelength of about 4000 Å. As another example, a photocathode composed mainly of a silverbismuth alloy has a peak in its photoelectric conversion ratio at wavelength of about 4500 Å but this ratio drops to about ½ of the peak value at wavelength of about 6000 Å. In order to eliminate this problem, photocathodes composed mainly of GaAs have been considered, but such photocathodes have the disadvantages of being expensive and that it is difficult to provide a large area. Moreover, since use is made of arsenic which is a harmful material, there is an additional problem of public harm in their production processes.

SUMMARY OF THE INVENTION

It is therefore an object of the present invention to provide a photocathode with a large area which can be easily made applicable to light of a wide range of wavelength, has a high photoelectric conversion ratio in a wide wavelength range, and can be produced inexpensively without causing any public harm.

A photocathode according to the present invention with which the above and other objects can be achieved is characterized as having a hetero junction with an n-type semiconductor thin film of $Cs_2O$ with a small electron affinity $\chi$ or a small work function $\phi$ such that the vacuum level will be low than the energy of the photogenerated electrons, an oxide of Ba, Sr, Ca, B and La that have large coefficients of secondary electron emission, $LaB_6$, $BaCO_3$, $SrCO_3$, $CaCO_3 \cdot SrCO_3 \cdot CaCO_3$, BaO·SrO·CaO or a mixture of any or all of the above formed on a p-type silicon thin film of an amorphous silicon (aSi) alloy having an energy gap matching the incident light energy for the purpose of photoelectric conversion.

If a photocathode thus structured is exposed to a beam of incident light with photon energy matching the energy gap of the amorphous silicon alloy of which the p-type amorphous silicon thin film is formed, the energy of this incident light is absorbed by the p-type amorphous silicon thin film layer and the electrons in the valence band are excited to the conduction band. The excited free electrons are diffused to the n-type semiconductor with their excess energy in the form of kinetic energy but since the work function $\phi$ of the n-type semiconductor is small, these free electrons can be emitted with sufficiently large kinetic energy. In other words, a highly efficient external photoelectric effect can be obtained.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Figure 1:
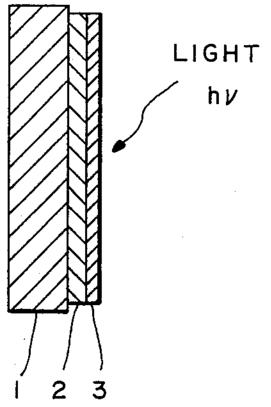
FIG. 1 is a sectional view of a photocathode embodying the present invention with external light made incident on its photoelectric surface.

In FIG. 1 which is a sectional view of a photocathode embodying the present invention, numeral 1 indicates an electroconductive substrate of Al or the like, numeral 2 indicates a p-type amorphous silicon type photoelectric thin film (such as p-type Si:H(B)) formed to a thickness of about 1–0.5 mμ and numeral 3 indicates an n-type semiconductor thin film of thickness about 100–200 Å made, for example, of $Cs_2O$ with a small electron affinity $\chi$ or work function $\phi$. The p-type amorphous silicon thin film 2 and the n-type $Cs_2O$ thin film form therebetween a hetero junction surface.

Figure 2:
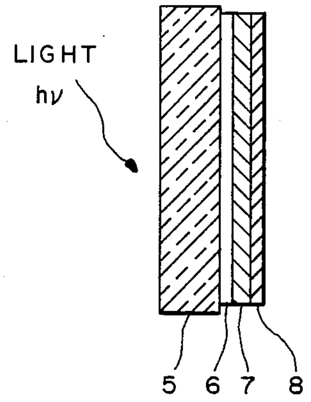
FIG. 2 is a sectional view of another photocathode embodying the present invention with light made incident from the side of its substrate.

FIG. 2 is a sectional view of another photocathode embodying the present invention for making light incident thereon from the side of its substrate. In FIG. 2, numeral 5 indicates a quartz plate or a substrate of glass or the like which transmits light, numeral 6 indicates a transparent electrode, numeral 7 indicates a p-type amorphous silicon photoelectric thin film formed to a thickness of about 1–2 mμ and numeral 8 indicates an n-type $Cs_2O$ thin film formed to a thickness of 100–200 Å. The p-type amorphous silicon thin film 7 and the n-type $Cs_2O$ thin film 8 form therebetween a hetero junction surface.

The amorphous silicon materials have quantum efficiency nearly equal to 1 and a high light absorption coefficient over a wide wavelength range from the visible light to the X-rays. By selecting a composition appropriately, furthermore, it is possible to obtain an amorphous silicon alloy having an energy gap matching the energy of the incident light. For example, $aSi_{1-x}Ge_x$:H(B) may be used against red incident light, aSi:H(B) against solar light or an incident light beam having a similar spectrum and $aSi_{1-x}N_x$:H(B) against ultraviolet incident light. Moreover, they have many favorable characteristics as a photoelectric conversion material such that they do not cause any public harm, that they can be produced inexpensively and that films with a large area can be produced.

Figure 3:
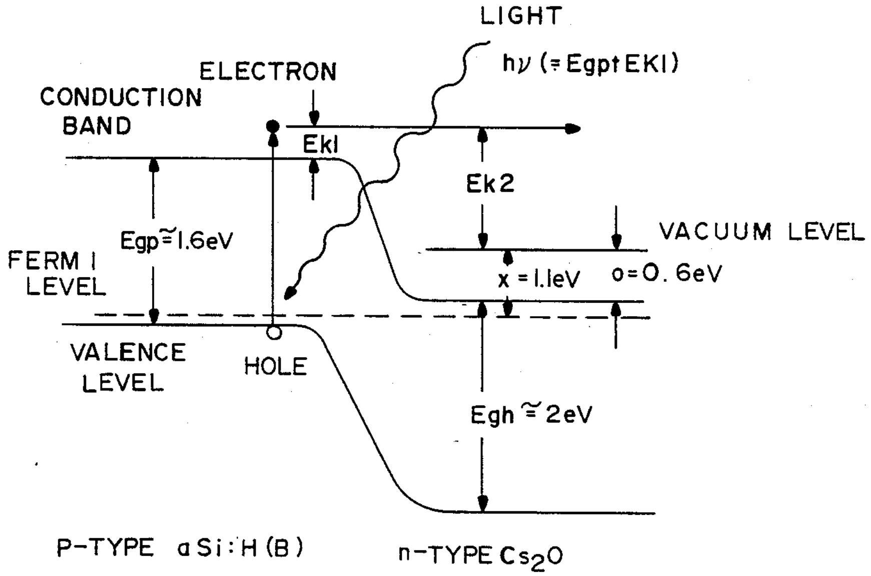
FIG. 3 is an energy band diagram of a p-n hetero junction part of a photocathode embodying the present invention.

If light with energy $h\nu$ (where h is the Planck's constant and $\nu$ is frequency) is made incident on a photocathode structured as described above, and if $h\nu$ is greater than the energy gap $E_{gp}$ (about 1.6 eV in the case of p-type aSi:H(B)) by $EK_1$ as shown in FIG. 3, it is absorbed by the aSi:H(B) layer where the coefficient of light absorption is large and quantum efficiency is nearly equal to 1, and electrons in the valence band are excited to the conduction band. Free electrons thus excited have kinetic energy $EK_1$ which is what is left of the absorbed light energy $h\nu$ after $E_{gp}$ which is necessary for their excitation to the conduction band is subtracted therefrom and these free electrons are diffused towards the n-type $Cs_2O$ layer with this kinetic energy. Since the excitation energy of the n-type $Cs_2O$ layer to the vacuum level, or its work function $\phi$, is very small, being about 0.6 eV, the energy difference $EK_2$ between the energy level of these diffused free electrons and the vacuum level of the n-type $Cs_2O$ layer is quite large. As a result, these free electrons are emitted into the vacuum with large kinetic energy which is approximately equal to $EK_2$. In other words, there results an external photoelectric effect of a high efficiency. In summary, $Cs_2O$ with small work function $\phi$ is used as the n-type semiconductor such that the incident light energy $h\nu$ is greater than the energy gap $E_{gp}$ of the p-type semiconductor which is greater than this work function $\phi$ of the n-type semiconductor and the p-type amorphous silicon alloy composition is appropriately selected to obtain an external photoelectric effect of a high efficiency.

Since Al, of which the substrate is made, can easily form an ohmic junction with aSi:H type materials, holes generated in aSi:H(B) by photo-excitation can be efficiently injected into the Al substrate and electrons can also be injected easily from the Al substrate to the photocathode. Moreover, since the aSi:H(B) film is about 1 mμ in thickness and is within the region where the energy band bends at the hetero junction section of $Cs_2O$, there is not much geminate recombination of excited electrons within amorphous silicon and these excited electrons diffuse into $Cs_2O$ by following the curve of the energy band to reach the surface of $Cs_2O$ and to be emitted.

Next, a method of producing a photocathode embodying the present invention will be described by way of an example wherein a hetero junction surface is formed by first forming a p-type aSi:H(B) thin film (as an example of p-type aSi thin film) on an Al substrate and then forming an n-type $Cs_2O$ thin film.

Firstly, a thin film of aSi:H(B) with thickness of 1 mμ is formed by a plasma CVD (chemical vapor deposition) method on an Al substrate of thickness 250 mμ. This is accomplished by mixing 30% of $B_2H_6$ gas diluted by $H_2$ to 0.1% into a source gas which is a mixture of $SiH_4$ and $H_2$ gases at the flow ratio of 1:1 and introducing this mixed gas into a reactor containing the Al substrate heated to 250° C. such that the total gas flow rate is 100 sccm while a 13.56-MHz RF power of 100W is applied for 20 minutes.

Figure 4:
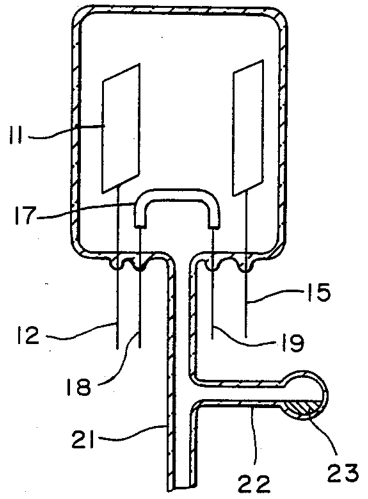
FIG. 4 is a drawing for showing a method of producing a photocathode embodying the present invention.

Secondly, as shown in FIG. 4, an electrode 12 is attached to the Al substrate 11 with a thin film of aSi:H(B) attached thereon, another electrode 15 is attached to an Al plate which is to serve as the anode and they are sealed inside a glass tube 16. At the same time, a source of cesium vapor deposition 17 (such as a mixture of cesium bichromate and silicon powder) is sealed inside and after a vacuum pump is operated to reduce the pressure to less than $10^{-4}$ torr inside the tube 16, the aforementioned source 17 is heated by a current through electrodes 18 and 19 so as to generate cesium gas and to form a thin film of cesium on the thin film of aSi:H(B) formed on the Al substrate 11.

Thirdly, a very small amount of oxygen source 23 such as a mixture of manganese peroxide and potassium chlorate powder is placed in a sealed branch 22 leading to a tube 21 connected to the aforementioned glass tube 16. It is then heated to generate oxygen gas such that the thin film of cesium formed on the aSi:H(B) thin film as explained above is oxidized and a thin film of $Cs_2O$ is formed. Although $Cs_2O$ is formed all over inside the glass tube 16 in this process, there is no ill-effect because the formed films are extremely thin.

Figure 5:
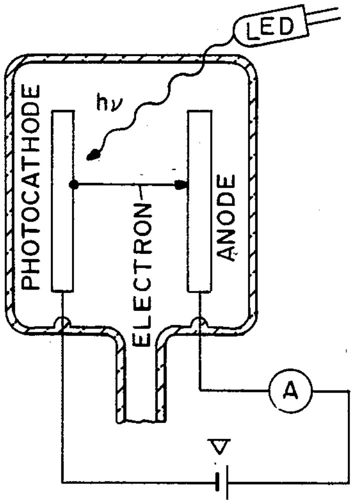
FIG. 5 is a drawing for showing a method of measuring the characteristics of a photocathode embodying the present invention.

What is thus obtained is a photoelectric conversion apparatus having sealed inside a glass tube a photocathode with a hetero junction formed by a p-type aSi:H(B) thin film on an Al substrate and an n-type $Cs_2O$ thin film and an anode. The negative terminal of a power source V was connected to this photocathode and the positive terminal of this power source to the anode through an ammeter A as shown in FIG. 5 to apply a voltage of 20V between the photocathode and the anode, and a beam of light with wavelength 635 mm from a light-emitting diode was made incident on the light-receiving surface of the photocathode. The intensity of the incident light was 0.65 $\mu W/cm^2$ and its light energy was about 1.9 eV so as to be sufficiently large for exciting electrons from the valence band across the energy gap $E_{gp}$ (approximately 1.6 eV) of p-type aSi:H(B). As a result, a current of 0.1 μA was detected by the ammeter A and the quantum efficiency of the photocathode was about 0.3. This means that an extremely high-efficiency photocathode has been obtained.

The foregoing description of a preferred embodiment of the invention has been presented for purposes of illustration and description. It is not intended to be exhaustive or to limit the invention to the precise form disclosed, and many modifications and variations are possible in light of the above teaching. For example, although $Cs_2O$ with small electron affinity $\chi$ or work function $\phi$ was used as the n-type semiconductor in the description of the present invention given above, this is not intended to limit the scope of the present invention. Use may alternatively be made of an oxide of Ba, Sr, Ca, B or La having large coefficient of secondary electron emission, $LaB_6$, $BaCO_3$, $SrCP_3$, $CaCO_3 \cdot SrCO_3 \cdot CaCO_3$, BaO·SrO·CaO or a mixture of these as well as of $Cs_2O$. Such modifications and variations which may be apparent to a person skilled in the art are intended to be included within the scope of this invention.

What is claimed is:

1. A photocathode comprising a p-type amorphous silicon thin film formed with an amorphous silicon alloy having an energy gap which matches photon energy of incident light, and an n-type semiconductor thin film composed of a material selected from the group which consists of $Cs_2O$, oxides of Ba, Sr, Ca, B and La, $LaB_6$, $BaCO_3$, $SrCO_3$, $CaCO_3 \cdot SrCO_3 \cdot CaCO_3$, BaO·SrO·CaO, and mixtures thereof, a hetero junction being formed between said p-type amorphous silicon type thin film and said n-type semiconductor thin film.

2. The photocathode of claim 1 further comprising an electroconductive substrate, said p-type amorphous silicon type thin film being formed on said electroconductive substrate.

3. The photocathode of claim 2 wherein said electroconductive substrate comprises Al.

4. The photocathode of claim 1 wherein said n-type semiconductor thin film comprises $Cs_2O$ with small electron affinity or work function.

5. The photocathode of claim 1 wherein said n-type semiconductor thin film is selected from the group consisting of oxides of Ba, Sr, Ca, B and La having large coefficients of secondary electron emission.

6. The photocathode of claim 1 wherein said p-type amorphous silicon type thin film is about 0.5–1 mμ in thickness.

7. The photocathode of claim 1 wherein said n-type semiconductor thin film is about 100–200 Å in thickness.

8. The photocathode of claim 1 further comprising a transparent electrode and a transparent substrate, said transparent electrode being sandwiched between said transparent substrate and said p-type amorphous silicon type thin film.

9. The photocathode of claim 8 wherein said transparent substrate comprises quartz.

10. The photocathode of claim 8 wherein said transparent substrate comprises glass.

11. The photocathode of claim 1 wherein said amorphous silicon alloy is $aSi_{1-x}Ge_x$:H(B).

12. The photocathode of claim 1 wherein said amorphous silicon alloy is aSi:H(B).

13. The photocathode of claim 1 wherein said amorphous silicon alloy is $aSi_{1-x}N_x$:H(B).

* * * * *